(12) United States Patent
Yu

(10) Patent No.: US 8,481,354 B2
(45) Date of Patent: Jul. 9, 2013

(54) METHODS OF CREATING A MICRO ELECTRO-MECHANICAL SYSTEMS ACCELEROMETER USING A SINGLE DOUBLE SILICON-ON-INSULATOR WAFER

(75) Inventor: Lianzhong Yu, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 390 days.

(21) Appl. No.: 12/795,367

(22) Filed: Jun. 7, 2010

(65) Prior Publication Data
US 2011/0300658 A1  Dec. 8, 2011

(51) Int. Cl.
*H01L 21/84* (2006.01)
(52) U.S. Cl.
USPC ....... 438/52; 438/412; 438/422; 257/E21.561
(58) Field of Classification Search
USPC .................. 438/52, 412, 422; 257/E21.561
See application file for complete search history.

(56) References Cited

U.S. PATENT DOCUMENTS 5,996,411 A * 12/1999 Leonardson et al. ...... 73/514.29

\* cited by examiner

*Primary Examiner* — Zandra Smith
*Assistant Examiner* — Toniae Thomas
(74) *Attorney, Agent, or Firm* — Lowe Graham Jones PLLC

(57) ABSTRACT

Methods for creating a microelectromechanical systems (MEMS) device using a single double, silicon-on-insulator (SOI) wafer. The double SOI wafer includes at least a base layer of silicon, a first layer of silicon, and a second layer of silicon, the layers of silicon are separated by an oxide layer. A stationary electrode with rigid support beams is formed into the second layer of silicon. A proof mass and at least one spring are formed into the first layer of silicon. The proof mass is separated from the stationary electrode by a first gap and the proof mass is separated from the base silicon layer by a second gap.

5 Claims, 8 Drawing Sheets

METHODS OF CREATING A MICRO ELECTRO-MECHANICAL SYSTEMS ACCELEROMETER USING A SINGLE DOUBLE SILICON-ON-INSULATOR WAFER

BACKGROUND OF THE INVENTION

Current Micro Electro-Mechanical Systems (MEMS) vertical, force-balanced accelerometers require upper and lower sensing plates that need accurate gap control and at least one bond performed on the sensing plate wafer. However, in a three-wafer bonding process, it is hard to control the gap and feature alignment accurately. Also, inaccuracy of the gap also occurs if a single-layer silicon-on-oxide (SOI) wafer is used because an upper sensing plate wafer must be bonded thereto.

SUMMARY OF THE INVENTION

The present invention provides methods for creating a parallel plate, Micro Electro-Mechanical Systems (MEMS) device using a single double, silicon-on-insulator (SOI) wafer. The double SOI wafer includes at least a base layer of silicon, a first layer of silicon, and a second layer of silicon, the layers of silicon are separated by an oxide layer. A stationary electrode with rigid support beams is formed into the second layer of silicon. A proof mass and at least one spring are formed into the first layer of silicon. The proof mass is separated from the stationary electrode by a first gap and the proof mass is separated from the base silicon layer by a second gap.

BRIEF DESCRIPTION OF THE DRAWINGS

Preferred and alternative embodiments of the present invention are described in detail below with reference to the following drawings:

FIG. 2 is a cross-sectional view of a double SOI wafer used for creating the MEMS accelerometer/gyro shown in FIGS. 1-1 through 1-3; and FIGS. 3-8 illustrate masks and etching steps performed for generating the MEMS accelerometer/gyro shown in FIGS. 1-1 through 1-3.

DETAILED DESCRIPTION OF THE INVENTION

Figure 1:
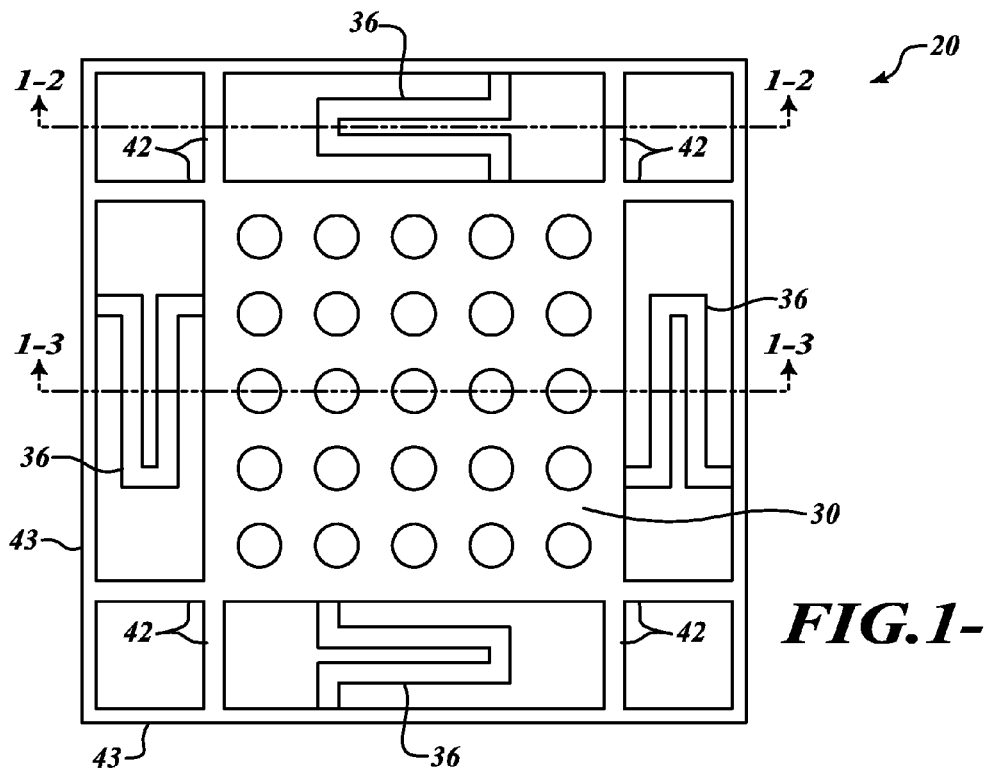
FIGS. 1-1 through 1-3 illustrate a MEMS accelerometer/gyro formed in accordance with an embodiment of the present invention.

FIG. 1-1 shows a top view of a Micro Electro-Mechanical Systems (MEMS) parallel plate, accelerometer/gyroscope device 20 using a single double silicon-on-insulator (SOI) wafer. The MEMS device 20 includes a top silicon layer that includes a stationary electrode 30 that is connected to a frame 43 of the device 20 via a plurality of rigid beams 42. During an acceleration event, the stationary electrode 30 does not move relative to the frame 43 because of the connection with the rigid beams 42.

A second silicon layer includes a proof mass 32 (see FIG. 1-3) that is supported by a plurality of springs 36 formed in the same silicon layer. The springs 36 are attached to the frame 43 and allow the proof mass 32 to move in either a horizontal or a vertical direction. The proof mass 32 is separated by predefined gaps from a substrate layer 40 that connects only to the frame 43 and from the stationary electrode 30 of the upper silicon layer (see FIG. 1-2). In one embodiment, the MEMS device 20 senses an acceleration force out of plane, in other words, perpendicular to the surface of the wafer. The springs 36 allow the proof mass 32 in this embodiment to move along the vertical axis, thereby changing the gap with the stationary electrode 30. Either the proof mass 32 or the stationary electrode 30 is electrically biased and the other one is connected to a sensing circuit (not shown) in order to determine a changing capacitance value of the MEMS device 20.

Thus, width of the gap formed between the stationary electrode 30 and the proof mass 32 is accurately controlled by an upper oxide layer that is formed between the two silicon layers. The thickness of the upper oxide layer is accurately controlled during the double SOI wafer creation process.

Figures 1, 2:
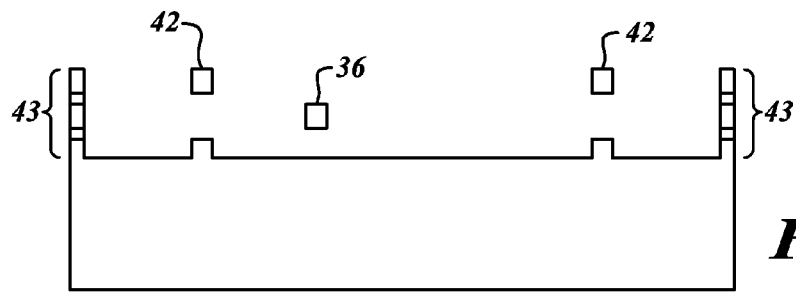
Figures 1, 2, 3:
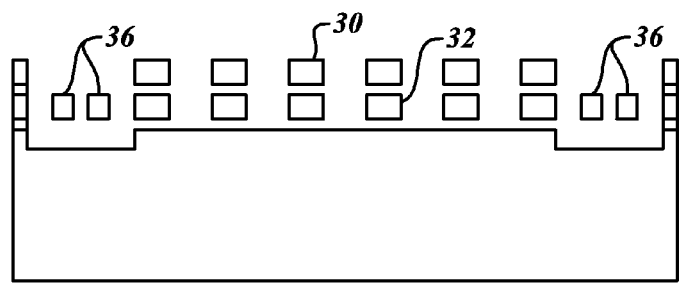
Figure 2:
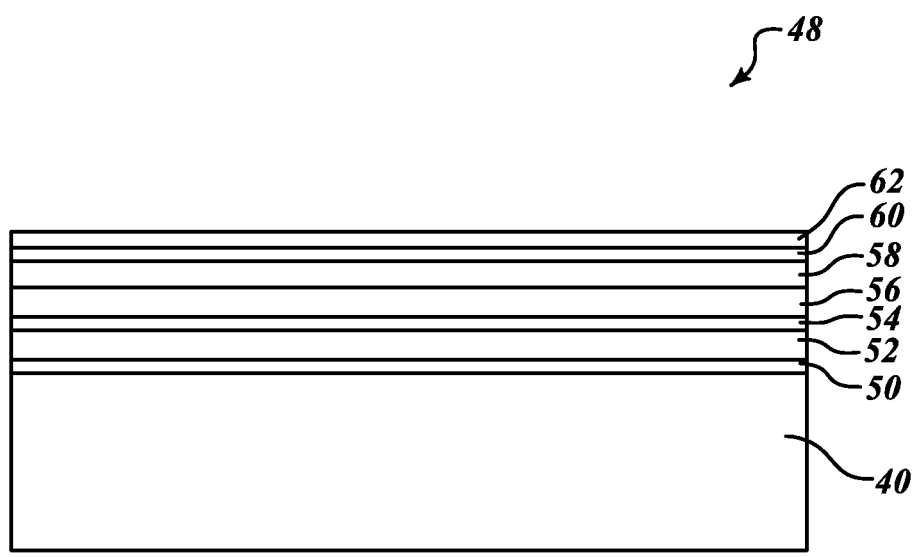
Figures 1, 3:
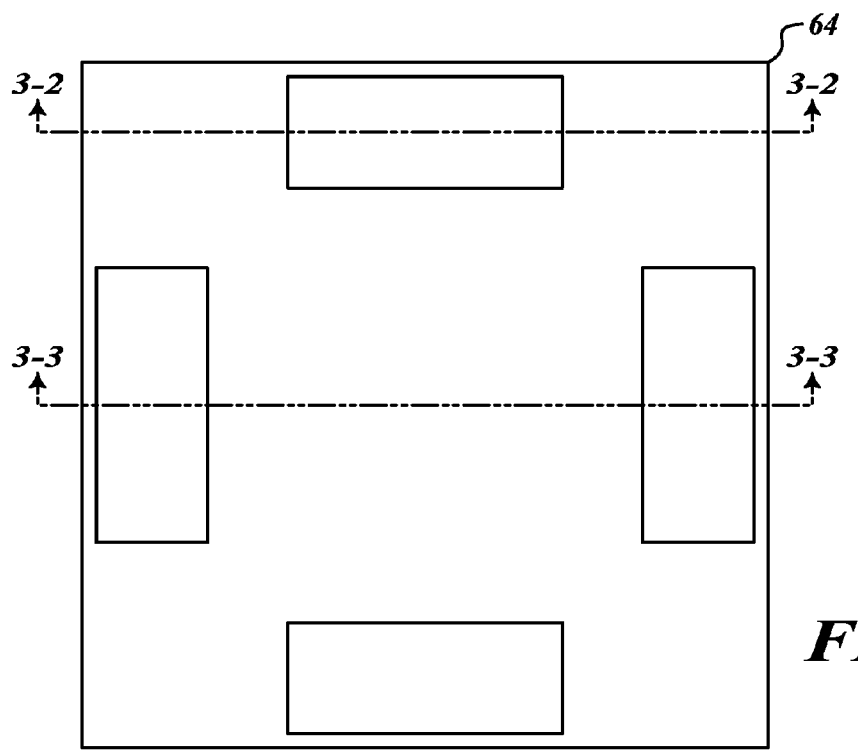
Figures 2, 3:
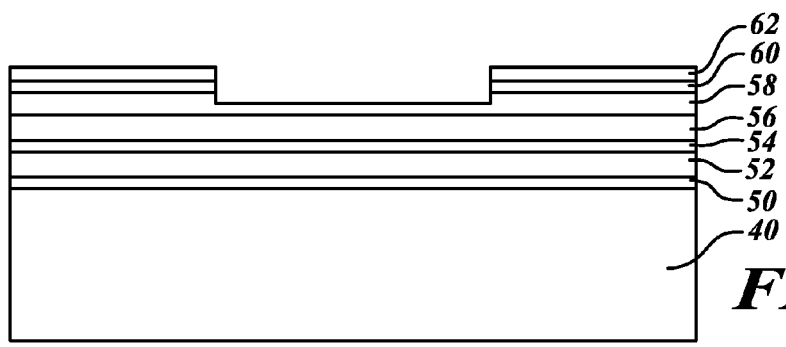
Figure 3:
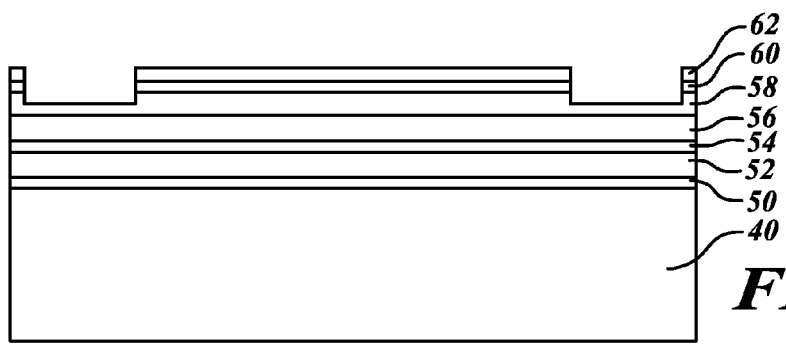

FIGS. 2-8 illustrate the process of creating the MEMS device 20 shown in FIGS. 1-1 through 1-3. First, one starts with a double SOI wafer 48 that includes the base silicon layer 40, followed by a first oxide layer 50 ($SiO_2$), a first silicon layer 52, a second oxide layer 54, and a second silicon layer 56. Then a third oxide layer 58 is grown into the second silicon layer 56. Next, a nitride ($Si_3Ni_4$) layer 60 is deposited on the third oxide layer 58. Finally, a fourth oxide layer 62 is deposited on top of the nitride layer 60 using a plasma-enhanced chemical vapor deposition (PECVD), low temperature chemical vapor deposition (LPCVD) or TEOS (tetraethoxysilane) oxide process.

FIG. 3-1 illustrates a first etching mask 64 that is used to etch into the fourth oxide layer 62, the nitride layer 60, and partially into the third oxide layer 58 at areas that will be occupied by the springs 36 (see FIGS. 3-2 and 3-3).

Figures 1, 4:
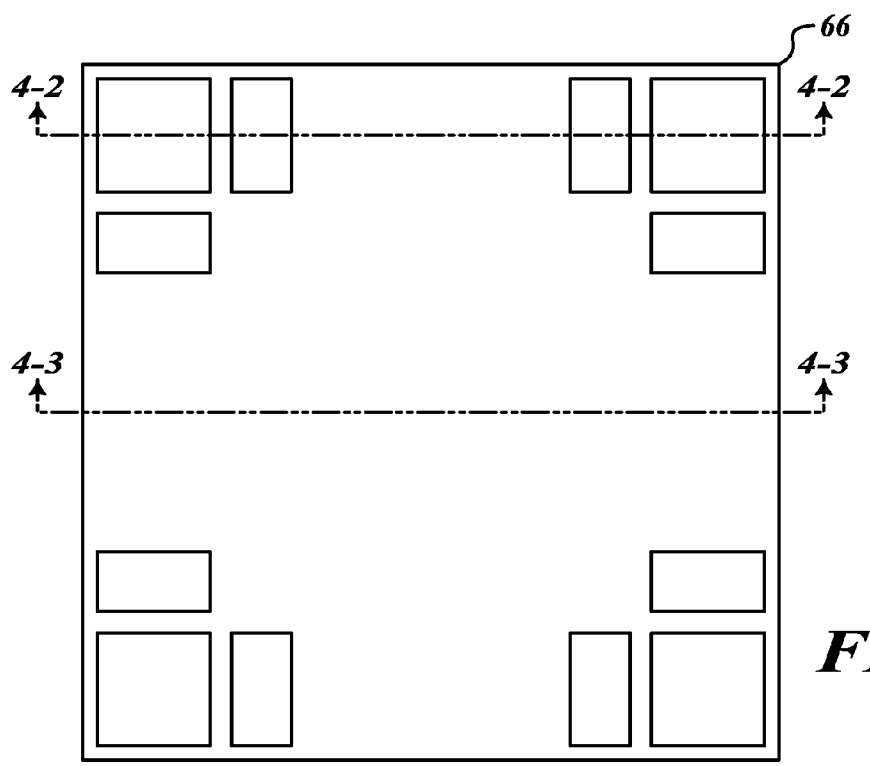
Figures 2, 4:
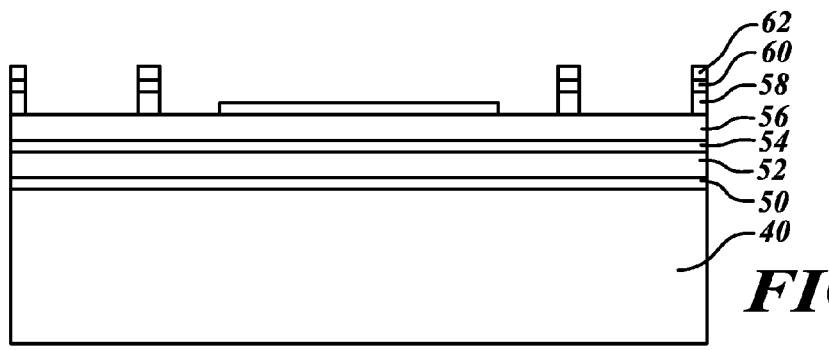
Figures 3, 4:
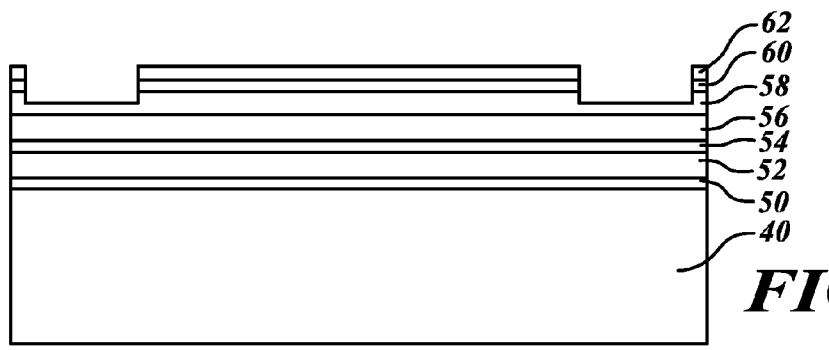

FIG. 4-1 illustrates a second mask 66 that begins the process of etching the rigid beams 42 of the second silicon layer 56. Using the second mask 66, the third and fourth oxide layers 58, 62 and the nitride layer 60 are etched around the areas that will be surrounding the rigid beams 42.

Figures 1, 5:
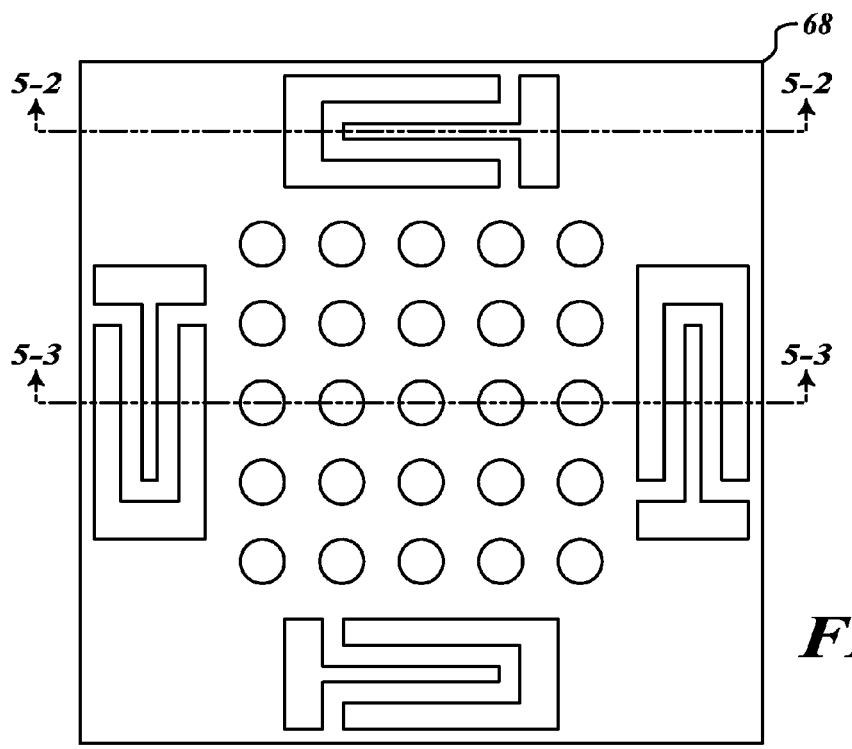
Figures 2, 5:
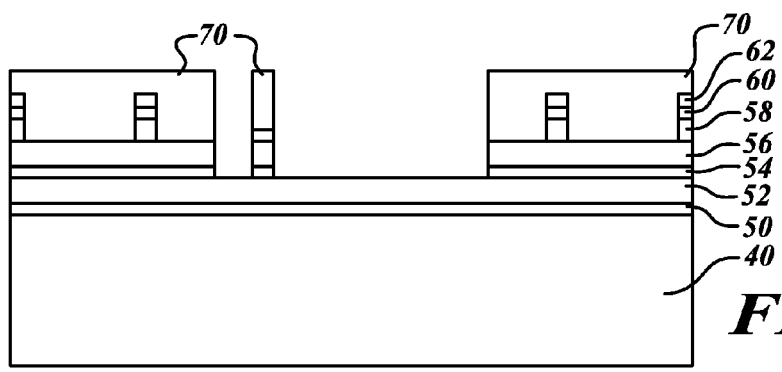
Figures 3, 5:
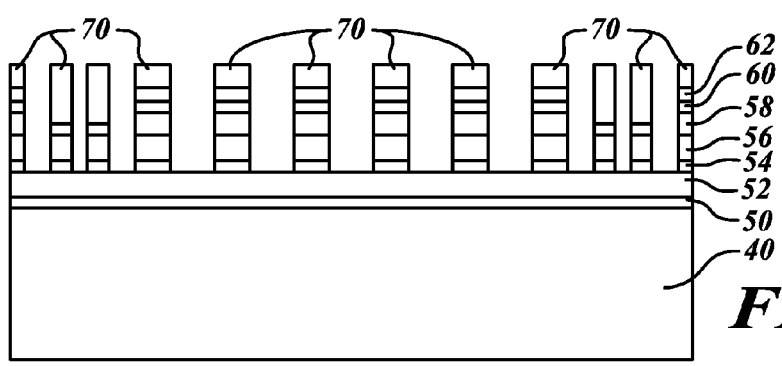

Next, as shown in FIG. 5-1, a third mask 68 is used for performing a further etch around the eventual springs 36 and for etching holes through the stationary electrode 30. FIGS. 5-2 and 5-3 illustrate the etching performed through the second through fourth oxide layers 54, 58, 62, the second silicon layer 56, and the nitride layer 60, according to the third mask 68. FIGS. 5-2 and 5-3 also illustrate a layer of photoresist 70 that is applied as part of this masking process.

Figures 1, 6:
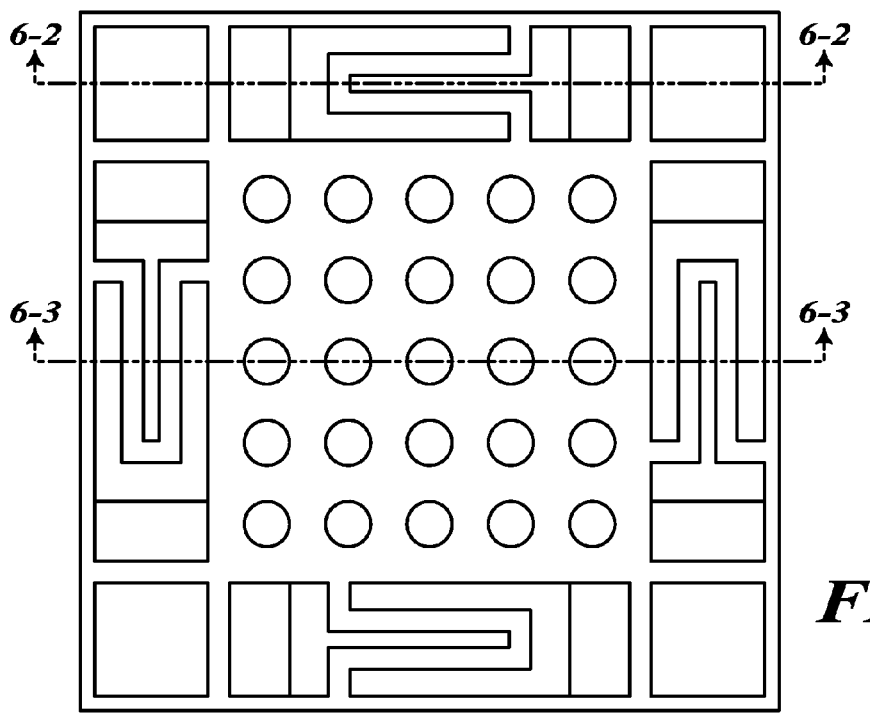
Figures 2, 6:
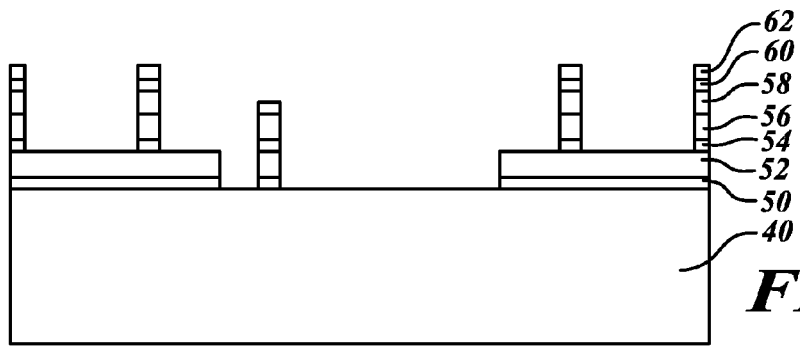
Figures 3, 6:
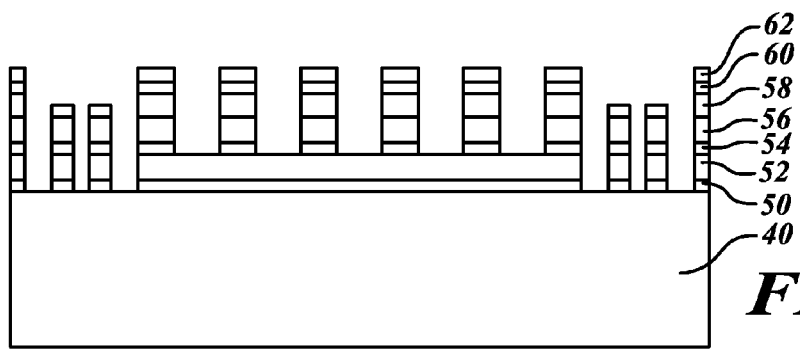

Next, as shown in FIGS. 6-1 through 6-3, a metal is sputtered onto the area defined by the using aperture mask which opens only on top of mass area covering all the access holes. The metal used is Al or Cr or a comparable metal. Next, in an area around the springs the first silicon layer 52 and the first oxide layer 50 are removed down to the base silicon layer 40. Then, the metal that was sputtered is removed. This results in a ledge of first silicon layer 52 and first oxide layer 50 protruding into an area previously etched by the first mask 64 where the springs are located. At the same time that this etch of the first silicon layer 52 and first oxide layer 50 is occurring, the second silicon layer 56 and second oxide layer 54 are removed from around the rigid beams 42. Then, the metal that was deposited in the holes and on the stationary electrode 30 is removed. Next, a layer of oxide is deposited, using a PECVD, LPCVD or TEOS process onto top of whole wafer. PECVD, LPCVD or TEOS provide conforming coatings which cover a top surface as well as sidewall of the etched silicon structure.

Since the oxide on the top of the springs 36 was less than that on the rest of the wafer (see FIGS. 4-2 and 4-3) all the oxide on the springs 36 is removed with still leave plenty of oxide on the other area. Then during the final Si DRIE etch the second Si layer 56 of the springs 36 is removed.

Figures 1, 7:
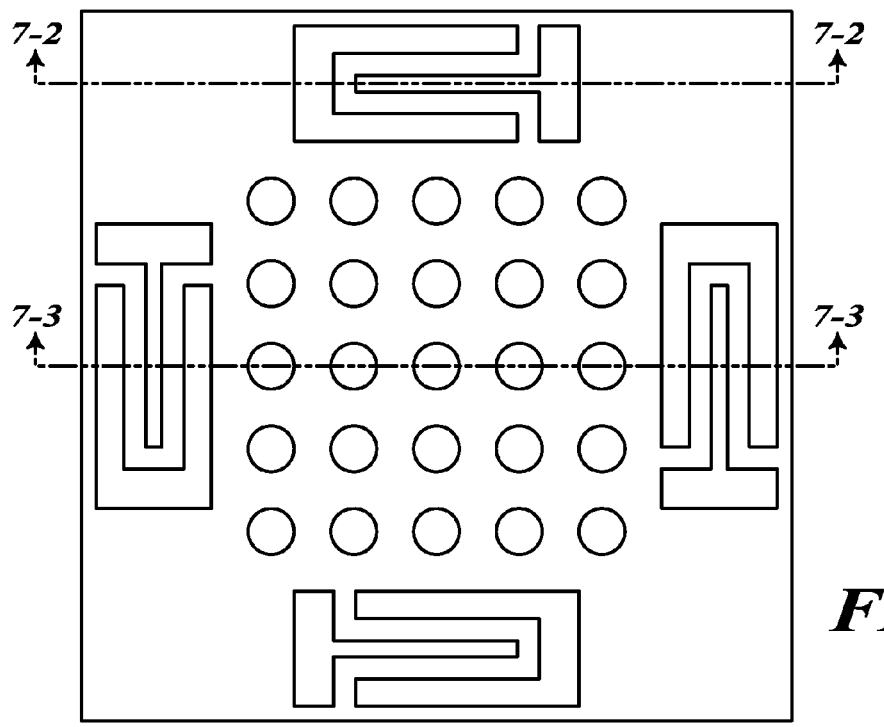
Figures 2, 7:
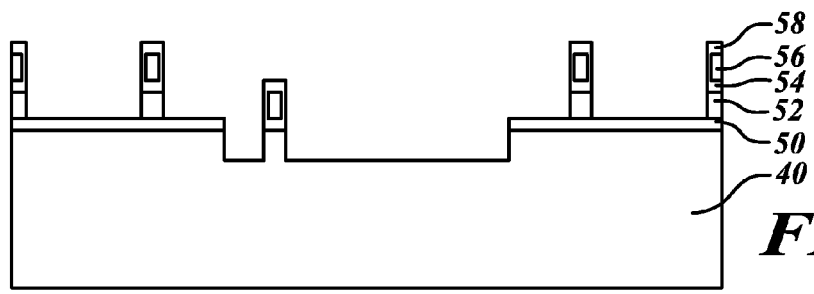
Figures 3, 7:
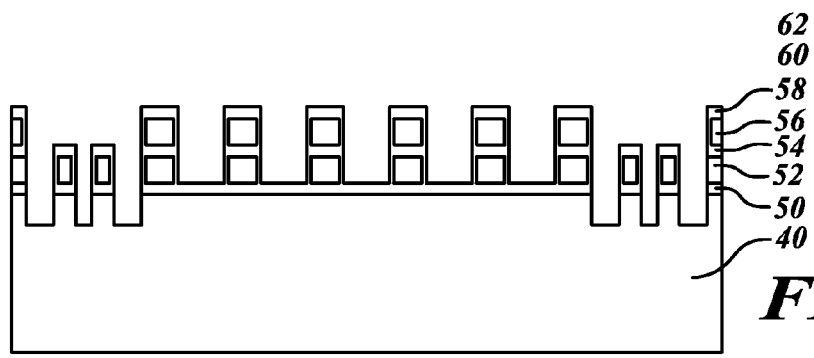

As shown in FIGS. 7-1 through 7-3, the third oxide layer 58 is etched to the second silicon layer 56 from above the springs. Then, the second silicon layer 56 above the springs is anisotropically etched and the first silicon layer 52 located around the beams 42 is etched to the first oxide layer 50. At the same time, the base silicon layer 40 that is exposed is removed at the same rate.

Figures 1, 8:
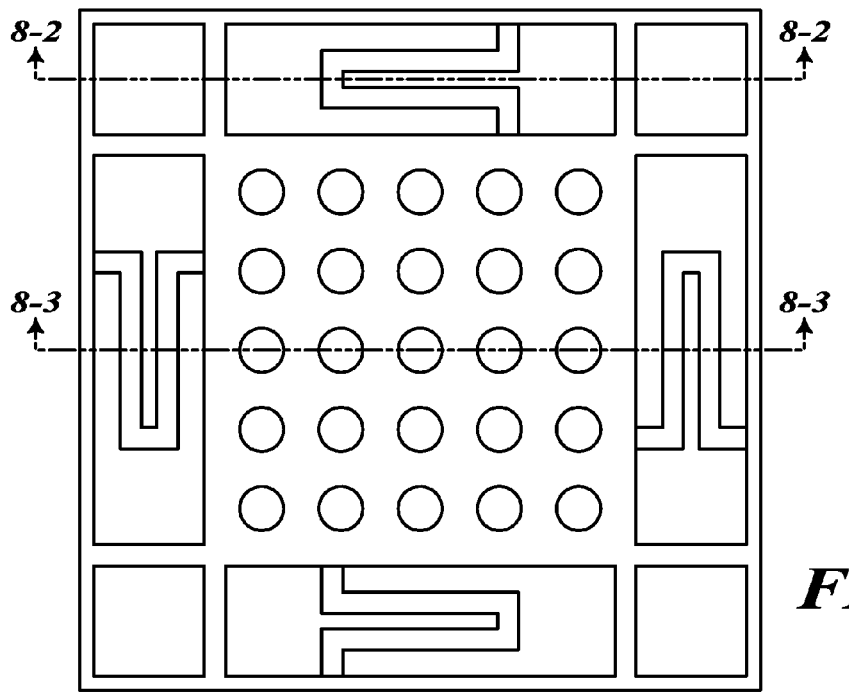
Figures 2, 8:
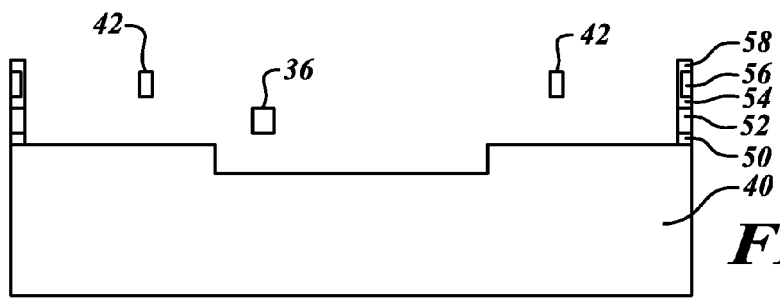
Figures 3, 8:
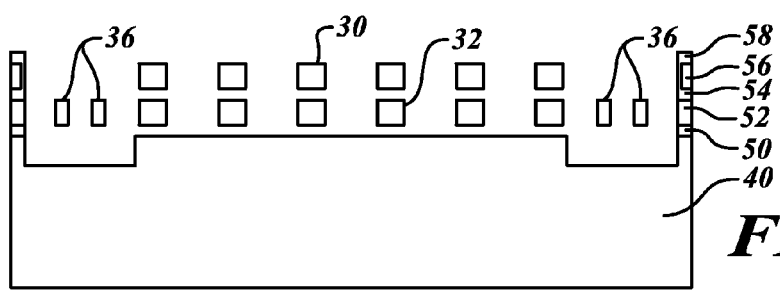

As shown in FIGS. 8-1 through 8-3, the base silicon layer 40 is isotropically etched in order to release the springs 36. Also, the beams 42 are released at the same time. This etch causes an insignificant amount of the first silicon layer 52 to be removed from the frame 43. This is done using a Xenon difluoride ($XeF_2$) process or wet KOH etch if (111) wafer is used. Next, all the remaining oxide is removed using fluoride (Hf) vapor process. Oxide removal from the frame area is very limited and within design tolerance.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for creating a microelectromechanical systems (MEMS) device using a double, silicon-on-insulator (SOI) wafer, wherein the double SOI wafer comprises a base layer of silicon, a first layer of silicon, and a second layer of silicon, the layers of silicon are separated by an oxide layer, the method comprising:
   a) forming a stationary electrode with rigid support beams into the second layer of silicon; and
   b) forming a proof mass and at least one spring into the first layer of silicon,
   wherein the proof mass is separated from the stationary electrode by a first gap and the proof mass is separated from the base silicon layer by a second gap.

2. The method of claim 1, further comprising performing the following prior to a) and b):
   applying a third oxide layer to the second silicon layer;
   applying a nitride layer to the third oxide layer; and
   applying a fourth oxide layer over the nitride layer.

3. The method of claim 2, further comprising:
   etching the fourth oxide layer, the nitride layer and part of the third oxide layer in a first spring area based on a first mask;
   etching the fourth oxide layer, the nitride layer and the third oxide layer in a rigid support area based on a second mask;
   etching the second and third oxide layers and the second silicon layer in the first spring area and the second—fourth oxide layers,
   the second silicon layer and the nitride layer in a stationary electrode area based on a third mask;
   protecting the electrode and rigid support beams;
   etching the first oxide layer and the first silicon layer down to the silicon base in an area around the at least one spring;
   anisotropically etching the first silicon layer around the at least one spring and proof mass;
   protecting the stationary electrode, the rigid beams, the proof mass and the at least one spring;
   anisotropically etching an unprotected area of the base silicon layer;
   isotropically etching the unprotected area of the base silicon layer thereby releasing the at least one spring; and
   removing oxide from around the at least one spring, the proof mass, the stationary electrode and the rigid beams in order to free the proof mass from the silicon base layer and the second silicon layer.

4. The method of claim 1, wherein the MEMS device is a parallel plate accelerometer.

5. The method of claim 1, wherein the MEMS device is a parallel plate gyroscope.

\* \* \* \* \*